(12) United States Patent
Kishimoto et al.

(10) Patent No.: US 10,734,599 B2
(45) Date of Patent: Aug. 4, 2020

(54) ORGANIC EL DISPLAY DEVICE AND METHOD FOR MANUFACTURING SAME

(71) Applicant: HON HAI PRECISION INDUSTRY CO., LTD., New Taipei (TW)

(72) Inventors: Katsuhiko Kishimoto, Osaka (JP); Kazunobu Mameno, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/313,038

(22) PCT Filed: Jul. 21, 2016

(86) PCT No.: PCT/JP2016/071384
§ 371 (c)(1),
(2) Date: Dec. 23, 2018

(87) PCT Pub. No.: WO2018/003129
PCT Pub. Date: Jan. 4, 2018

(65) Prior Publication Data
US 2019/0229287 A1 Jul. 25, 2019

(30) Foreign Application Priority Data
Jun. 30, 2016 (JP) .................................. 2016-131013

(51) Int. Cl.
*H01L 51/52* (2006.01)
*H01L 27/32* (2006.01)
(Continued)

(52) U.S. Cl.
CPC ...... *H01L 51/5237* (2013.01); *H01L 27/3244* (2013.01); *H01L 51/5012* (2013.01); *H01L 51/5256* (2013.01); *H01L 51/56* (2013.01)

(58) Field of Classification Search
None
See application file for complete search history.

(56) References Cited

U.S. PATENT DOCUMENTS 9,419,245 B2 * 8/2016 Kamiya ............... H01L 51/5225
10,276,830 B2 * 4/2019 Kishimoto .......... H01L 51/5256
(Continued)

FOREIGN PATENT DOCUMENTS

JP 2011-113967 A 6/2011
JP 2013-20893 A 1/2013
(Continued)

OTHER PUBLICATIONS

Written Search Report (English translation) of PCT/JP2016/071384 (Year: 2016).*

*Primary Examiner* — Telly D Green
(74) *Attorney, Agent, or Firm* — ScienBiziP, P.C.

(57) ABSTRACT

An organic EL display device (100) according to an embodiment of the present invention includes an organic EL element (3) formed on a flexible substrate (1) and a thin film encapsulation structure (10) formed on the organic EL element (3). The thin film encapsulation structure (10) includes a first inorganic barrier layer (12), an organic barrier layer (14) in contact with the first inorganic barrier layer (12), and a second inorganic barrier layer (16) in contact with the organic barrier layer (14). The organic barrier layer (14) is present on at least a part of a flat portion, and a surface of the organic barrier layer (14) is oxidized. A method for producing the organic EL display device (100) in an embodiment includes the step of asking the organic barrier layer.

14 Claims, 9 Drawing Sheets

(51) Int. Cl.
*H01L 51/50* (2006.01)
*H01L 51/56* (2006.01)

(56) References Cited

U.S. PATENT DOCUMENTS

| | | | |
|---|---|---|---|
| 10,276,837 B2* | 4/2019 | Narutaki | H01L 51/56 |
| 2011/0121355 A1 | 5/2011 | Bae et al. | |
| 2015/0060822 A1* | 3/2015 | Kamiya | H01L 51/5225 |
| | | | 257/40 |
| 2017/0162637 A1* | 6/2017 | Choi | G09G 3/20 |
| 2019/0019993 A1* | 1/2019 | Narutaki | H01L 51/56 |
| 2019/0058160 A1* | 2/2019 | Kishimoto | H01L 51/5256 |
| 2019/0207162 A1* | 7/2019 | Kishimoto | B05D 1/60 |

FOREIGN PATENT DOCUMENTS

| | | | | |
|---|---|---|---|---|
| JP | 2013-186971 A | | 9/2013 | |
| JP | 2015-050022 A | | 3/2015 | |
| JP | 2015-176717 A | * | 10/2015 | ........ H01L 21/31127 |
| JP | 2016-39120 A | | 3/2016 | |
| WO | 2014/196137 A | | 12/2014 | |

\* cited by examiner (a)

(b)

(a)

(b)

(c)

(d)

(a)

(b)

(c)

(d)

ORGANIC EL DISPLAY DEVICE AND METHOD FOR MANUFACTURING SAME

TECHNICAL FIELD

The present invention relates to an organic EL display device, specifically, a flexible organic EL display device, and a method for producing the same.

BACKGROUND ART

Organic EL (Electro-Luminescence) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) controlling an electric current to be supplied to each of the at least one OLED). Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed in order to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to form a thin film that provides a sufficiently low water vapor transmission rate (WVTR). From the point of view of moisture-resistance reliability of the OLED display device, such a thin film encapsulation structure is typically required to have a WVTR lower than, or equal to, $10^{-4}$ g/m$^2$/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem that the bendability of the OLED display device is limited.

There is also a problem that the mass-productivity is low. The relatively thick organic barrier layer described above is formed by use of a printing technology such as an inkjet method, a microjet method or the like. By contrast, an inorganic barrier layer is formed by a thin film deposition technology in a vacuum atmosphere (e.g., lower than, or equal to, 1 Pa). The formation of the organic barrier layer by use of a printing method is performed in the air, whereas the formation of the inorganic barrier layer is performed in vacuum. Therefore, the element substrate is put into, and out of, a vacuum chamber during the formation of the thin film encapsulation structure, which decreases the mass-productivity.

Under such a situation, as disclosed in, for example, Patent Document 1, a film formation device capable of producing an inorganic barrier layer and an organic barrier layer continuously has been developed.

Patent Document 2 discloses a thin film encapsulation structure including a first inorganic material layer, a first resin member and a second inorganic material layer provided in this order, with the first inorganic material layer being the lowest layer among the three layers. In this thin film encapsulation structure, the first resin member is present locally, more specifically, around a protruding portion of the first inorganic material layer (first inorganic material layer covering a protruding portion). According to Patent Document 2, the first resin member is present locally, more specifically, around the protruding portion, which may not be sufficiently covered with the first inorganic material layer. With such a structure, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at a temperature lower than, or equal to, room temperature. As a result, the organic material is condensed and put into liquid drops on the substrate. The organic material in liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document 3 also discloses an OLED display device including a similar thin film encapsulation structure.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent Publication No. 2016-39120

SUMMARY OF INVENTION

Technical Problem

The thin film encapsulation structure described in each of Patent Documents Nos. 2 and 3 does not include a thick organic barrier layer, and therefore, is considered to improve the bendability of the OLED display device. In addition, since the inorganic barrier layer and the organic barrier layer may be formed continuously, the mass-productivity is also improved.

However, according to the studies made by the present inventors, there is room for improvement in mass-productivity. Also, there is room for improvement in moisture-resistance reliability and/or resistance against bending.

In such a situation, the present invention has an object of providing an organic EL display device, including a thin film encapsulation structure including a relatively thin organic barrier layer, that is improved in the mass-productivity, the moisture-resistance reliability and/or the resistance against bending, and a method for producing the same.

Solution to Problem

An organic EL display device according to an embodiment of the present invention includes an organic EL element formed on a flexible substrate; and a thin film encapsulation structure formed on the organic EL element. The thin film encapsulation structure includes a first inorganic barrier layer, an organic barrier layer in contact with the first inorganic barrier layer, and a second inorganic barrier layer in contact with the organic barrier layer; and the organic barrier layer is present on at least a part of a flat portion, and a surface of the organic barrier layer is oxidized. Herein, the "flat portion" refers to a flat portion of a surface of the organic EL element on which the thin film encapsulation structure is formed, more specifically, a part that is lowest in such a flat portion. It should be noted that the "flat portion" does not include a portion in which a particle (microscopic dust particle) is attached to the surface of the organic EL element.

In an embodiment, the organic barrier layer has an opening on the flat portion, and the organic barrier layer present on the flat portion has an area size larger than an area size of the opening. Namely, a part of the organic barrier layer that is actually present on the flat portion (may also be referred to as a "solid portion") has an area size larger than an area size of the opening. The area size of the solid portion, in the organic barrier layer on the flat portion (including the solid portion and the opening), is 50% or greater of the area size of the acrylic resin layer on the flat portion. It is preferred that the area size of the solid portion is 80% or greater of the area size of the acrylic resin layer on the flat portion. It is more preferred that the organic barrier layer on the flat portion does not have the opening.

In an embodiment, the organic barrier layer present on the flat portion has a thickness of 10 nm or greater.

In an embodiment, the organic barrier layer present on the flat portion has a maximum thickness less than 200 nm.

In an embodiment, the first and second inorganic barrier layers are each an SiN layer having a thickness of 200 nm or greater and 1000 nm or less. The film stress of the SiN layer has an absolute value of preferably 100 MPa or less, and more preferably 50 MPa or less. It is preferred that the SiN layer is formed at a temperature of 90° C. or lower.

A method for producing an organic EL display device according to an embodiment of the present invention is a method for producing any one of the organic EL display devices described above. The method includes the steps of preparing, in a chamber, the organic EL element having the first inorganic barrier layer formed thereon; supplying a vapor-like or mist-like acrylic monomer into the chamber; condensing the acrylic monomer on the first inorganic barrier layer to form a liquid film; irradiating the liquid film of the acrylic monomer with ultraviolet light to form an acrylic resin layer; and partially ashing the acrylic resin layer to form the organic barrier layer.

In an embodiment, the step of ashing is performed such that more than 50% of the acrylic resin layer formed on the flat portion is left. The ashing is performed by plasma ashing using at least one type of gas among $N_2O$, $O_2$ and $O_3$.

Advantageous Effects of Invention

An embodiment of the present invention provides an organic EL display device, including a thin film encapsulation structure including a relatively thin organic barrier layer, that is improved in the mass-productivity and/or the moisture-resistance reliability, and a method for producing the same.

DESCRIPTION OF EMBODIMENTS

Hereinafter, an OLED display device and a method for producing the same according to embodiments of the present invention will be described with reference to the drawings. The embodiments of the present invention are not limited to those described below as examples. The OLED display device includes a plurality of pixels, and each of the pixels includes at least one organic EL element (OLED). Hereinafter, a structure corresponding to one OLED will be described for simplicity.

Figure 1:
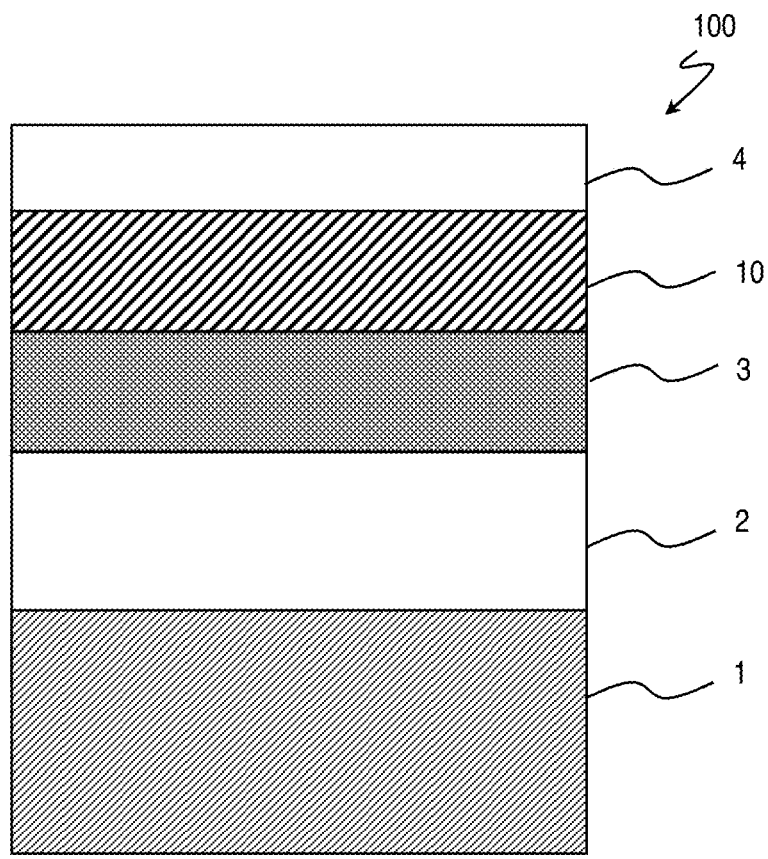
FIG. 1(a) is a schematic partial cross-sectional view of an OLED display device according to an embodiment of the present invention.
FIG. 1(b) is a partial cross-sectional view of a TFE structure 10 formed on an OLED 3.
Figure 1:
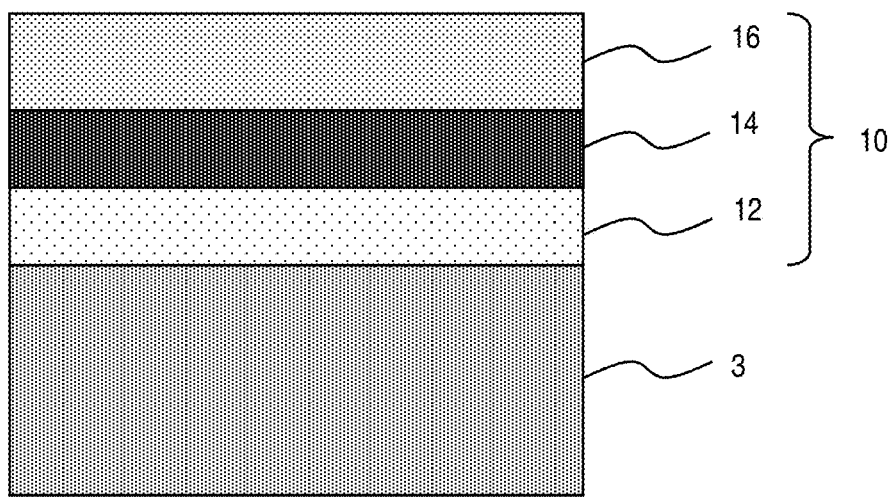

FIG. 1(a) is a schematic partial cross-sectional view of an OLED display device according to an embodiment of the present invention.

A circuit (back plane) 2 including a TFT is formed on a substrate 1, and an OLED 3 is formed thereon. The OLED 3 is of a top emission type. A thin film encapsulation (TFE) structure 10, which is one feature of the OLED display device according to an embodiment of the present invention is formed on the OLED 3. An uppermost portion of the OLED 3 is, for example, a top electrode or a cap layer (refractive index adjusting layer). A polarizing plate 4 is located on the TFE structure 10.

The substrate 1 is, for example, a polyimide film having a thickness of 15 μm. The circuit 2 including the TFE has a thickness of, for example, 4 μm. The OLED 3 has a thickness of, for example, 1 μm. The TFE structure 10 has a thickness of, for example, less than, or equal to, 1 μm.

FIG. 1(b) is a partial cross-sectional view of the TFE 10 formed on the OLED 3. A first inorganic barrier layer (e.g., SiN layer) 12 is formed immediately on the OLED 3, an organic barrier layer (e.g., acrylic resin layer) 14 is formed on the first inorganic barrier layer 12, and a second inorganic barrier layer (e.g., SiN layer) 16 is formed on the organic barrier layer 14. A surface of the organic barrier layer 14 (surface closer to the second inorganic barrier layer 16) is oxidized by asking.

For example, the first inorganic barrier layer 12 and the second inorganic barrier layer 16 are each an SiN layer having a thickness of, for example, 400 nm, and the organic barrier layer 14 is an acrylic resin layer having a thickness less than 100 nm. The thicknesses of the first inorganic barrier layer 14 and the second inorganic barrier layer 16 are each independently 200 nm or greater and 1000 nm or less, and the thickness of the organic barrier layer 14 is 50 nm or greater and less than 200 nm. The TFE structure 10 has a thickness of, preferably, 400 nm or greater and less than 2 μm, and more preferably, 400 nm or greater and less than 1 μm.

Figure 2:
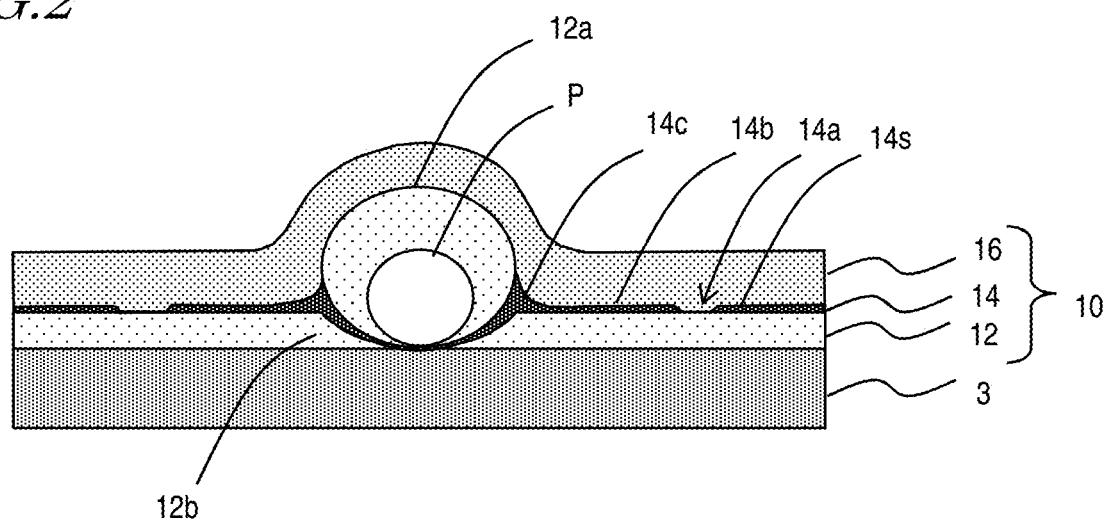
FIG. 2 is a schematic partial cross-sectional view of the TFE structure 10 in the OLED display device according to an embodiment of the present invention, and shows a portion including a particle P.
Figure 3:
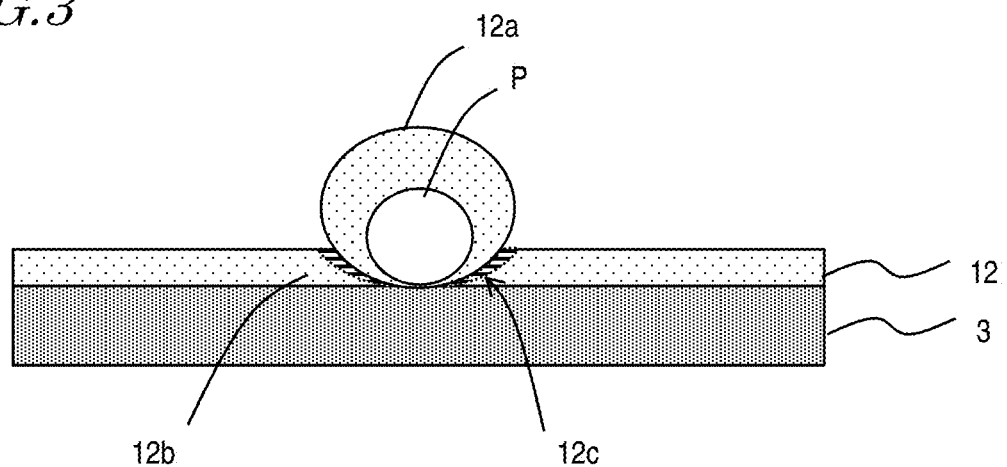
FIG. 3 is a schematic cross-sectional view of a first inorganic barrier layer (SiN layer) covering the particle P.

FIG. 2 is a schematic partial cross-sectional view of the TFE structure 10 in the OLED display device according to an embodiment of the present invention, and shows a portion including a particle P. FIG. 3 is a schematic cross-sectional view of the first inorganic barrier layer (SiN layer) covering the particle P. The particle P is a microscopic dust particle generated during the production of the OLED display device, and is, for example, a microscopic piece of broken glass, a metal particle or an organic particle. Such a particle is especially easily generated in the case where mask vapor deposition is used.

Figure 4:
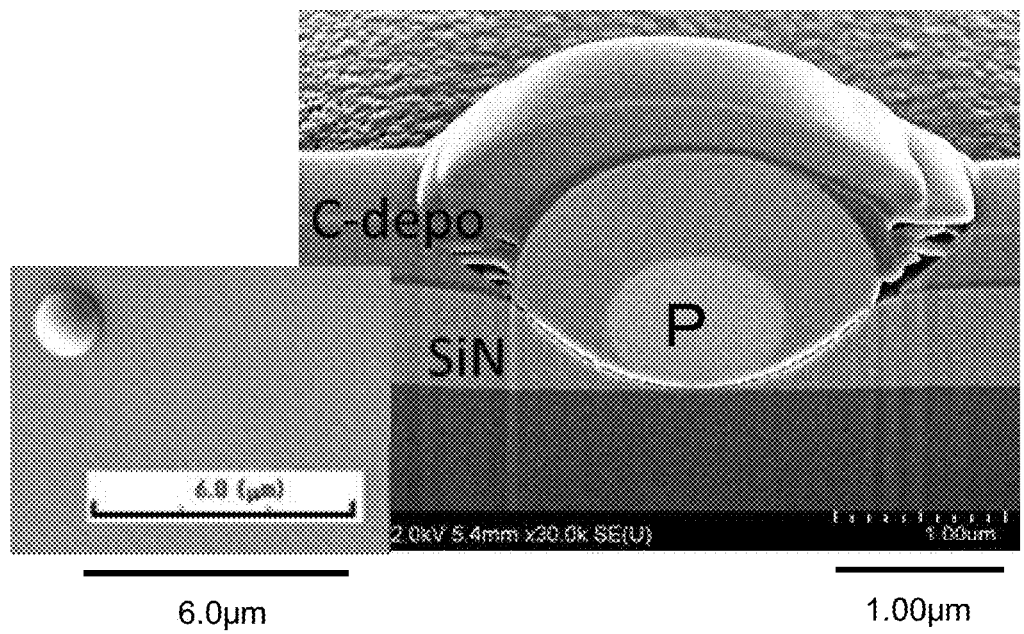
FIG. 4 shows a cross-sectional SEM image of a first inorganic barrier layer (SiN layer) covering a particle (silica sphere having a diameter of 1 μm), and also shows a planar SEM image (bottom left).

As shown in FIG. 3, in the case where the particle P (having a diameter, for example, longer than, or equal to, 1 μm) is present, a crack (defect) 12*c* may be formed in the first inorganic barrier layer. Based on a cross-sectional SEM image shown in FIG. 4, this is considered to be caused by impingement of an SiN layer 12*a* growing from a surface of the particle P and an SiN layer 12*b* growing from a flat portion of a surface of the OLED 3. In the case where such a crack 12*c* is present, the level of barrier property of the TFE structure 10 is decreased. The cross-sectional SEM image shown in FIG. 4 is of a sample of an SiN film formed by deposition by use of plasma CVD in the state where a silica sphere having a diameter of 1 μm is located as the particle P on a glass substrate. The cross-section does not pass the center of the particle P. A carbon layer (C-depo) at an outermost surface is used to protect the sample at the time of cross-section processing. As can be seen, mere presence of a relatively small silica sphere having a diameter of 1 μm results in the formation of the crack (defect) 12*c* in the SiN layer.

Figure 5:
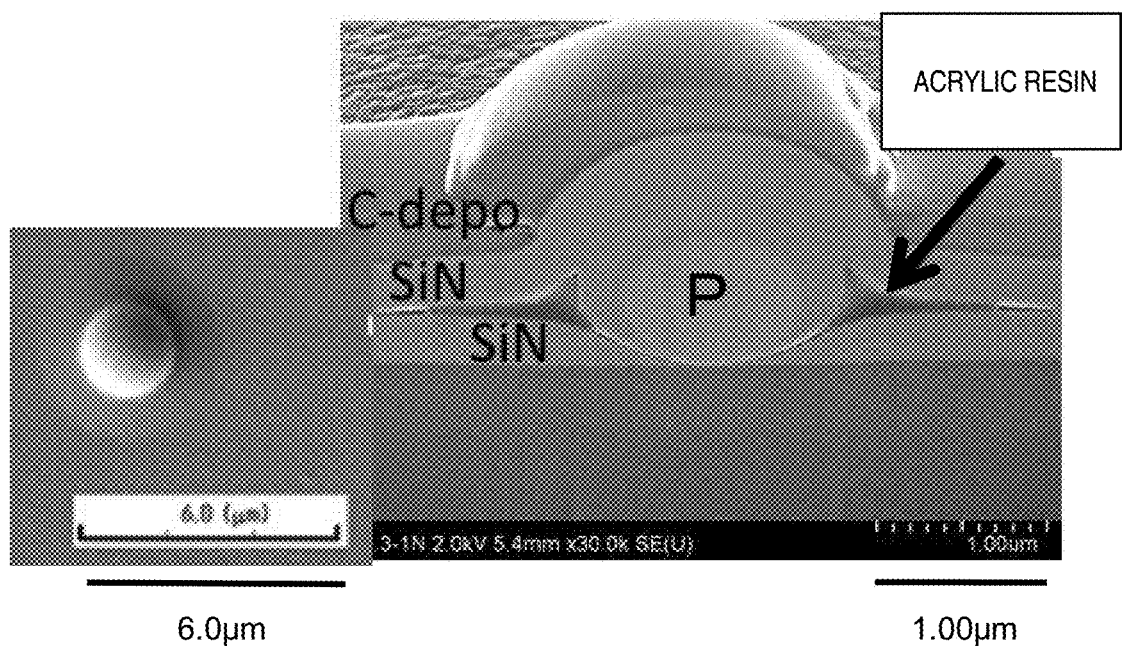
FIG. 5 shows a cross-sectional SEM image of a TFE structure covering a particle (silica sphere having a diameter of 2.15 μm), and also shows a planar SEM image (bottom left).
Figure 6:
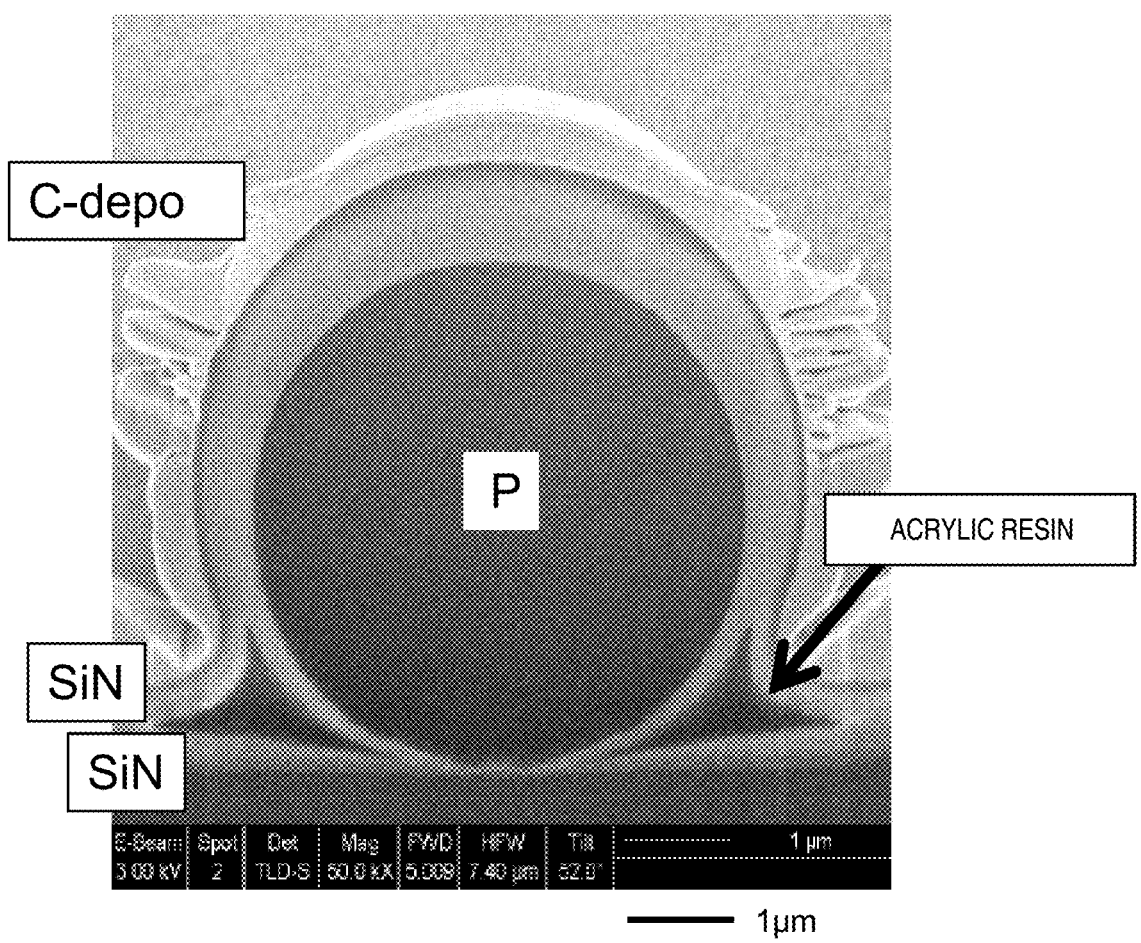
FIG. 6 shows a cross-sectional SEM image of a TFE structure covering a particle (silica sphere having a diameter of 4.6 μm).

In the TFE structure 10 in the OLED display device in the embodiment, as shown in FIG. 2, an organic barrier layer 14*c* is formed to fill the crack 12*c* of the first inorganic barrier layer 12. Therefore, the level of barrier property is kept high. This may be confirmed by a cross-sectional SEM image shown in each of FIG. 5 and FIG. 6. In FIG. 5 and FIG. 6, no interface is observed at a position where the second inorganic barrier layer 16 is formed directly on the first inorganic barrier layer 12. In FIG. 2, however, the first inorganic barrier layer 12 and the second inorganic barrier layer 16 are shown with different types of hatching for easier understanding.

The cross-sectional SEM image shown in FIG. 5 is of a sample of a film formed in the state where a silica sphere having a diameter of 2.15 μm is located on a glass substrate, like the cross-sectional SEM image shown in FIG. 4. The cross-sectional SEM image shown in FIG. 6 is of a sample of a film formed in the state where a larger particle (silica sphere having a diameter of 4.6 μm) is located on a glass substrate. The samples shown in these cross-sectional SEM images are each formed as follows. An SiN film is formed by deposition by use of plasma CVD so as to cover the particle P (silica sphere having a diameter of 2.15 μm or 4.6 μm) like in the case of FIG. 4, then, an acrylic resin layer is formed as the organic barrier layer 14, and then, another SiN film is formed by deposition by use of plasma CVD. As can be seen from a comparison against FIG. 4, in the case where, as shown in FIG. 5, the particle P has a diameter about twice as long as that of the particle P shown in FIG. 4, and even in the case where, as shown in FIG. 6, the particle P has a diameter about five times as long as that of the particle P shown in FIG. 4, the SiN film formed on the acrylic resin layer is a fine film with no defect.

As described below, the organic barrier layer 14 shown in FIG. 2 is formed of, for example, an acrylic resin. It is especially preferred that the organic barrier layer is formed by curing an acrylic monomer (acrylate) having a viscosity of about 1 to about 100 mPa·s at room temperature (e.g., 25° C.) by ultraviolet light. An acrylic monomer having such a low viscosity may easily permeate into the crack 12*c*. The acrylic resin has a high visible light transmittance and thus is preferably usable for a top emission-type OLED display device. A photoinitiator may be optionally incorporated into the acrylic monomer.

A surface of the organic barrier layer 14*c* filling the crack 12*c* connects a surface of the first inorganic barrier layer 12*a* on the particles P and a surface of an organic barrier layer 14*b* formed on the flat portion of the surface of the OLED 3 to each other continuously and smoothly. Therefore, the second inorganic barrier layer (SiN layer) 16 formed on the first inorganic barrier layer 12 on the particle P, and on organic barrier layer 14, is fine with no defect.

A surface 14*s* of the organic barrier layer 14 is oxidized by ashing, and thus is hydrophilic and highly adhesive to the second inorganic barrier layer 16.

It is preferred that the organic barrier layer 14 is asked so as to be left on the entire surface except for a protruding portion 12*a* of the first inorganic barrier layer, formed on the particle P. The organic barrier layer 14 may have an opening 14*a* on a part of the flat portion of the surface of the OLED 3. The ashing may be varied in the plane. Therefore, a portion of the organic barrier layer 14 that is formed on the flat portion may be completely removed to expose the surface of the first inorganic barrier layer 12. Even in this case, the organic barrier layer (solid portion) 14*b*, of the organic barrier layer 14, formed on the flat portion of the OLED 3 is controlled to have an area size larger than that of the opening 14*a*. More specifically, the solid portion 14*b* is controlled to have an area size that is larger than 50% of the area size of the acrylic resin layer 14 on the flat portion. It is preferred that the area size of the solid portion 14*b* is 80% or greater of the area size of the acrylic resin layer 14, and it is more preferred that the organic barrier layer 14 on the flat portion does not have any opening. It is preferred that the organic barrier layer present on the flat portion has a thickness of 10 nm or greater.

As a result of various experiments performed by the present inventor, it is found to be preferred that the organic barrier layer 14 is formed on the entirety of the flat portion, more specifically, on the entire surface except for the protruding portion 12*a* of the first inorganic barrier layer. It is preferred that the organic barrier layer 14 has a thickness of 10 nm or greater.

In the case where the organic barrier layer 14 is present between the first inorganic barrier layer 12 and the second inorganic barrier layer 16, the adhesiveness between the layers in the TFE structure 10 is increased. Specifically, since the surface of the organic barrier layer 14 is oxidized, the adhesiveness between the organic barrier layer 14 and the second inorganic barrier layer 16 is high. Therefore, the moisture-resistance reliability of the OLED display device is improved.

In the case where the organic barrier layer 14 is formed on the entirety of the flat portion (in the case where the organic barrier layer 14 does not have the opening 14a), when an external force is applied to the OLED display device, the stress (or strain) caused to the TFE structure 10 is uniformly distributed. As a result, breakage (especially, breakage of the first inorganic barrier layer 12 and/or the second inorganic barrier layer 16) is suppressed. The organic barrier layer 14 present substantially uniformly in close contact with the first inorganic barrier layer 12 and the second inorganic barrier layer 16 is considered to act to distribute and alleviate the stress. As can be seen, the organic barrier layer 14 also provides an effect of improving the resistance against bending of the OLED display device. It should be noted that if the organic barrier layer 14 has a thickness of 200 nm or greater, the resistance against bending may be decreased, it is preferred that the thickness of the organic barrier layer 14 is less than 200 nm.

Figure 7:
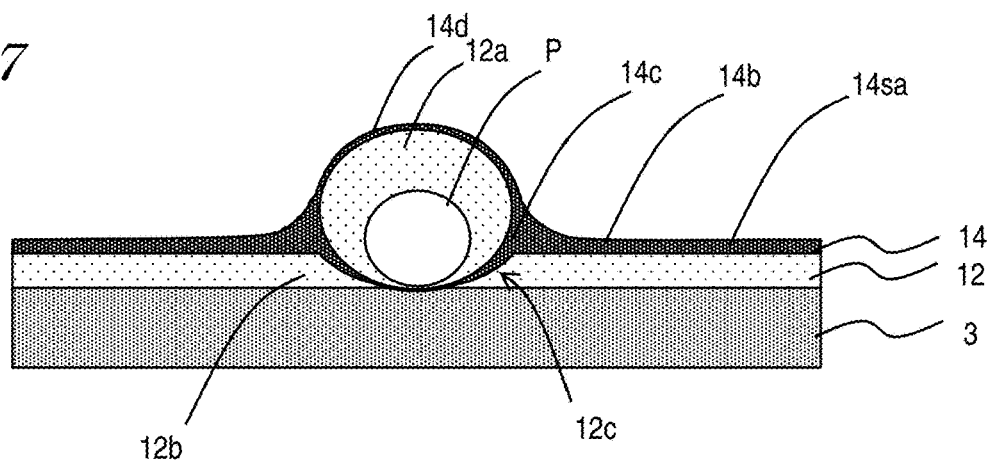
FIG. 7(a) through FIG. 7(d) are schematic cross-sectional views provided to illustrate a step of forming an organic barrier layer 14.
Figure 7:
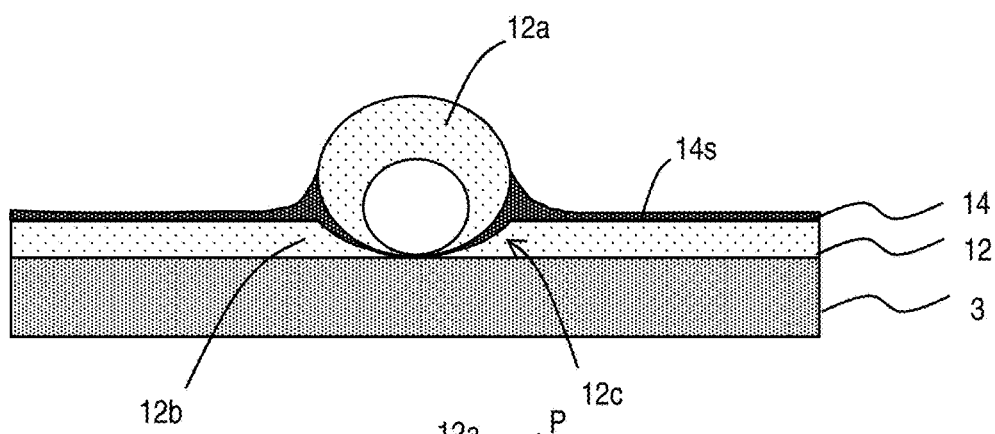
Figure 7:
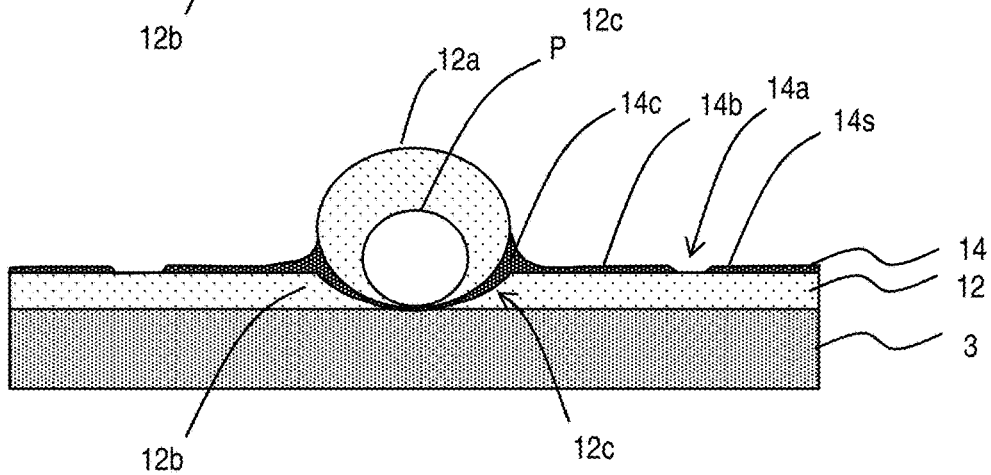
Figure 7:
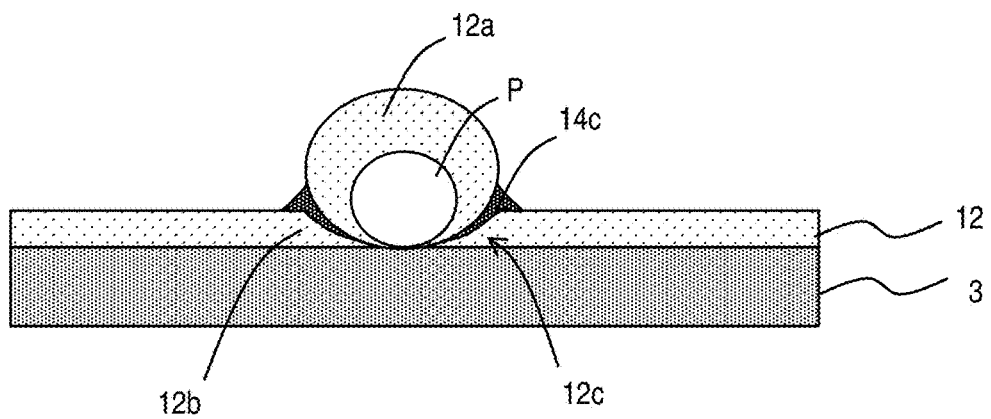
Figure 8:
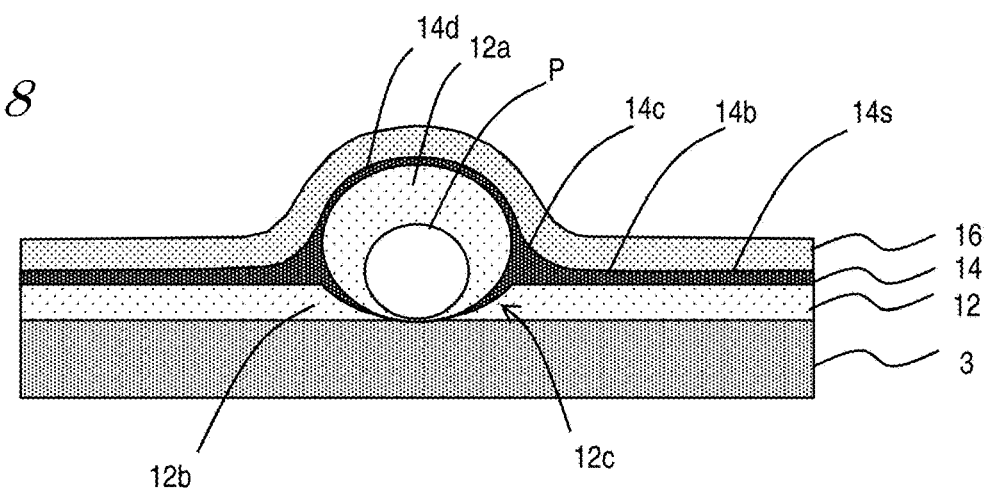
FIG. 8(a) through FIG. 8(d) are schematic cross-sectional views provided to illustrate a step of forming a second inorganic barrier layer 16.
Figure 8:
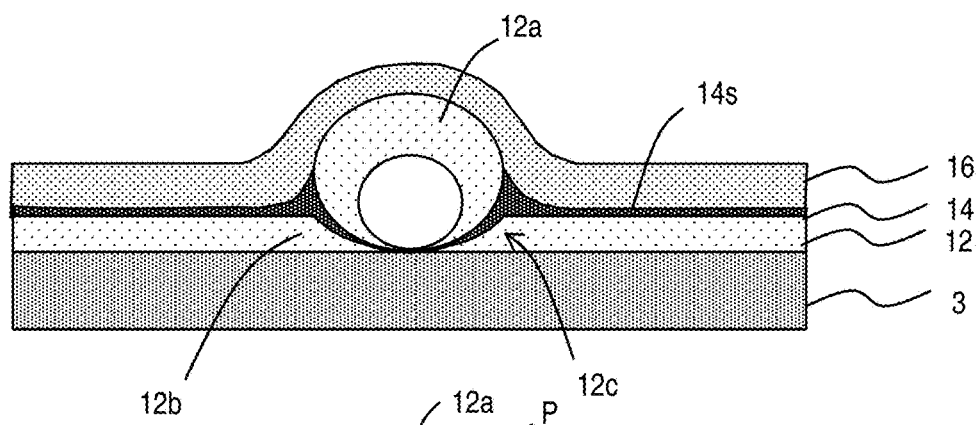
Figure 8:
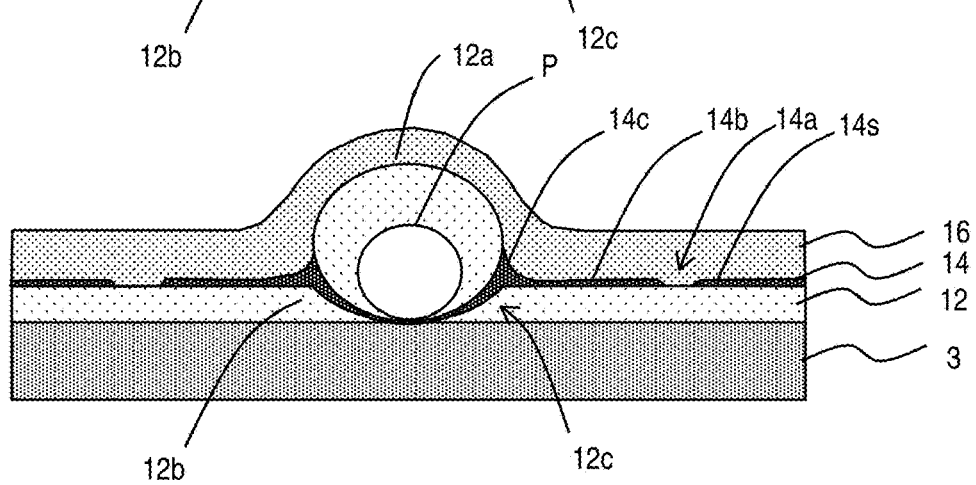
Figure 8:
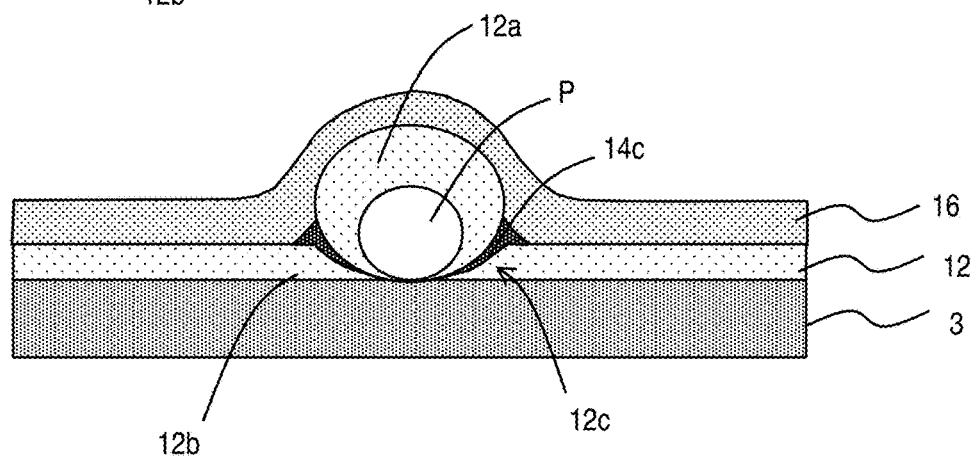

With reference to FIG. 7 and FIG. 8, a step of forming the organic barrier layer 14 and the second inorganic barrier layer 16, especially, the step of asking, will be described. FIG. 7 shows the step of forming the organic barrier layer 14, and FIG. 8 shows the step of forming the second inorganic barrier layer 16.

As schematically shown in FIG. 7(a), the first inorganic barrier layer 12 covering the particle P on the surface of the OLED 3 is formed, and then the organic barrier layer 14 is formed on the first inorganic barrier layer 12. The organic barrier layer 14 is formed by, for example, condensing a vapor-like or mist-like acrylic monomer on a cooled element substrate and then irradiating the acrylic monomer with ultraviolet light to cure the acrylic monomer. An acrylic monomer having a low viscosity may be used, so that the acrylic monomer permeates into the crack 12c formed in the first inorganic barrier layer 12. FIG. 7(a) shows an example in which an organic barrier layer 14d is formed on the first inorganic barrier layer 12a on the particle P. There may be a case where the acrylic monomer is not deposited (or attached), or is deposited (or attached) in an extremely small amount, on the first inorganic barrier layer 12a on the particle P, in the case where the particle P is of a certain size or a certain shape or in the case where the acrylic monomer is of a certain type. The organic barrier layer 14 may be formed by use of, for example, a film formation device 200 shown in FIG. 12 and described below. The organic barrier layer 14 is adjusted to have an initial thickness of 100 nm or greater and 500 nm or less on the flat portion. The organic barrier layer 14 in the initial state thus formed has a surface 14sa, which is smoothly continuous and hydrophobic. For the sake of simplicity, the organic barrier layer in a pre-ashing state bears the same reference sign as that of the organic barrier layer in a post-ashing state.

Then, as shown in FIG. 7(b), the organic barrier layer 14 is asked. The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet light irradiation, may be performed. In the case where an SiN film is formed by CVD as each of the first inorganic barrier layer and the second inorganic barrier layer, $N_2O$ is used as a material gas. Therefore, use of $N_2O$ for the ashing provides an advantage that the device is simplified.

In the case where the ashing is performed, the surface 14s of the organic barrier layer 14 is oxidized and thus is modified to be hydrophilic. In addition, the surface 14s is shaved almost uniformly, and extremely tiny convexed and concaved portions are formed, which increases the surface area size. The effect of increasing the surface area size provided by the ashing is greater for the surface of the organic barrier layer 14 than for the first inorganic barrier layer 12 formed of an inorganic material. Since the surface 14s of the organic barrier layer 14 is modified to be hydrophilic and the surface area size of the surface 14s is increased, the adhesiveness of the organic barrier layer 14 with the second inorganic barrier layer 16 is increased.

When the ashing is advanced, the opening 14a may be formed in a part of the organic barrier layer 14 as shown in FIG. 7(c).

When the ashing is further advanced, the organic barrier layer 14c is left only in the vicinity of the crack 12c of the first inorganic barrier layer 12 as shown in FIG. 7(d). The surface of the organic barrier layer 14c connects the surface of the first inorganic barrier layer 12a on the particle P and the surface of the flat portion of the OLED 3 to each other continuously and smoothly.

In order to increase the adhesiveness between the first inorganic barrier layer 12 and the organic barrier layer 14, the surface of the first inorganic barrier layer 12 may be asked before the organic barrier layer 14 is formed.

Now, with reference to FIG. 8, the structure after the second inorganic barrier layer 16 is formed on the organic barrier layer 14 will be described.

FIG. 8(a) schematically shows a structure provided as follows: the surface 14sa of the organic barrier layer 14 shown in FIG. 7(a) is oxidized by asking and thus is modified to be hydrophilic, and then the second inorganic barrier layer 16 is formed. In this example, the surface 14sa of the organic barrier layer 14 is slightly asked, so that the organic barrier layer 14d is left on the first inorganic barrier layer 12a on the particle P. Alternatively, there may be a case where the organic barrier layer 14 is not formed (or is not left) on the first inorganic barrier layer 12a on the particle P.

As shown in FIG. 8(a), the second inorganic barrier layer 16 formed on the organic barrier layer 14 has no defect, and is highly adhesive with the organic barrier layer 14.

As shown in FIG. 8(b) through FIG. 8(d), the second inorganic barrier layer 16 formed on the organic barrier layer 14 shown in each of FIG. 7(b) through FIG. 7(d) has no defect and is highly adhesive with the organic barrier layer 14. Even though the organic barrier layer 14 is completely removed from the flat portion of the OLED 3, the second inorganic barrier layer 16 has no defect and is highly adhesive with the organic barrier layer 14 as long as the surface of the organic barrier layer 14c connects the surface of the first inorganic barrier layer 12a on the particle P and the surface of the flat portion of the OLED 3 to each other continuously and smoothly.

It is preferred that the organic barrier layer 14 is ashed so as to be left in a small thickness on the entire surface except for the protruding portion 12a of the first inorganic barrier layer formed on the particle P. From the point of view of the moisture-resistance reliability and/or the resistance against bending, it is preferred that the thickness of the organic barrier layer 14 on the flat portion is 10 mm or greater and less than 200 nm as described above. Namely, the structure shown in FIG. 8(b) is most preferred. However, asking may be varied in the plane. Therefore, there may be a case where a portion of the organic barrier layer 14 that is formed on the flat portion is completely removed to expose the surface of the first inorganic barrier layer 12. Since the material and the size of the particle P are varied, there may be a case where the organic barrier layer 14 is not left on the entirety of the flat portion 12. Namely, there may be portion having the structure shown in FIG. 8(c) or FIG. 8(d). Even in the case where a portion of the organic barrier layer 14 formed on the flat portion is completely removed, it is preferred that a portion of the organic barrier layer 14, more specifically, the organic barrier layer 14b formed on the flat portion of the OLED 3, is controlled to have an area size larger than that of the opening 14a.

Figure 9:
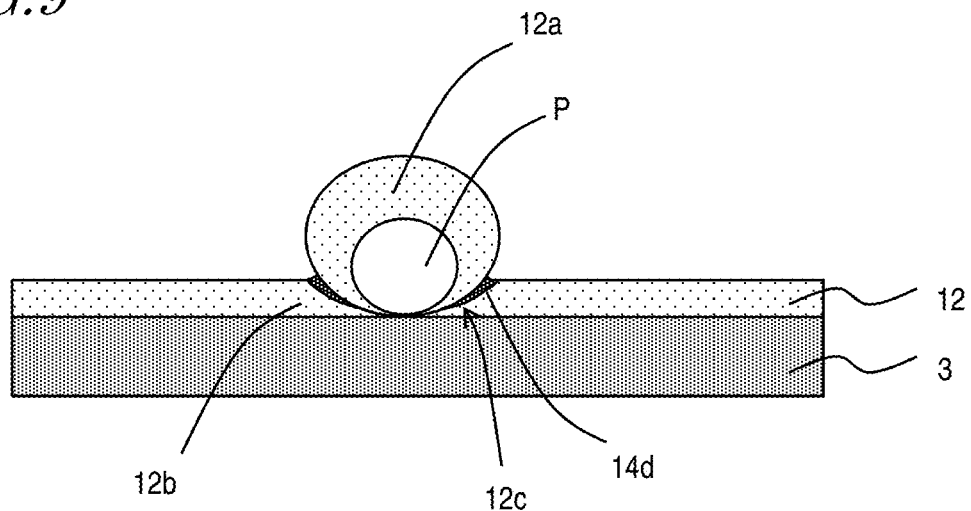
FIG. 9 is a schematic cross-sectional view showing an organic barrier layer 14d excessively ashed.
Figure 10:
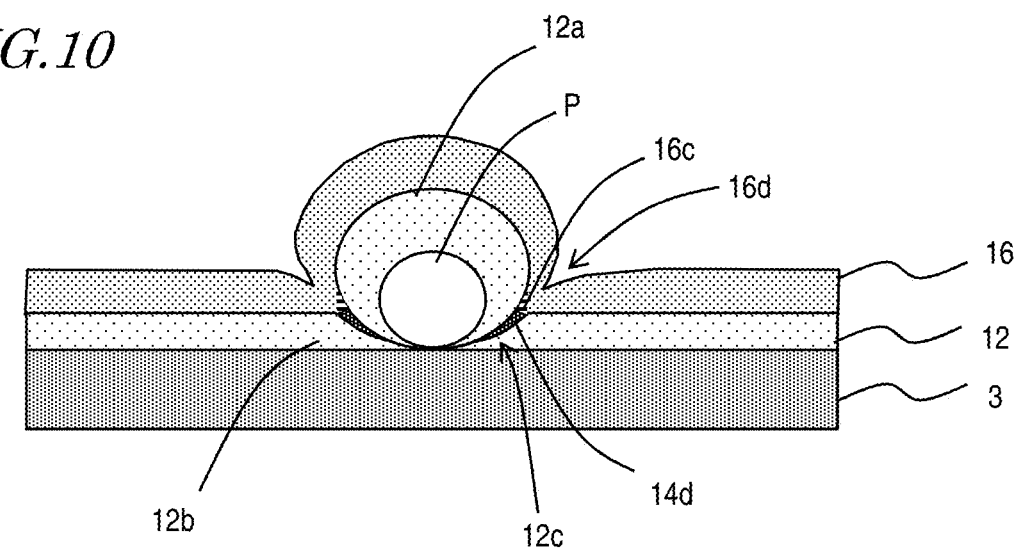
FIG. 10 is a schematic cross-sectional view showing a second inorganic barrier layer 16 formed on the organic barrier layer 14d excessively ashed.

In the case where the organic barrier layer 14 is ashed excessively, as shown in FIG. 9, the organic barrier layer 14 formed on the flat portion of the OLED 3 is completely removed, and further the organic barrier layer 14d filling the crack 12c formed by the particle P is decreased in size and fails to make the surface of the underlying layer for the second inorganic barrier layer 16 continuous or smooth. As a result, as shown in FIG. 10, a defect 16c is formed in the second inorganic barrier layer 16, which decreases the level of barrier property of the TFE structure. Even if the defect 16c is not formed, if an acute recessed portion 16d is formed at the surface of the second inorganic barrier layer 16, a stress tends to concentrate at the acute recessed portion 16d, which causes a crack to be formed easily by an external force.

Figure 11:
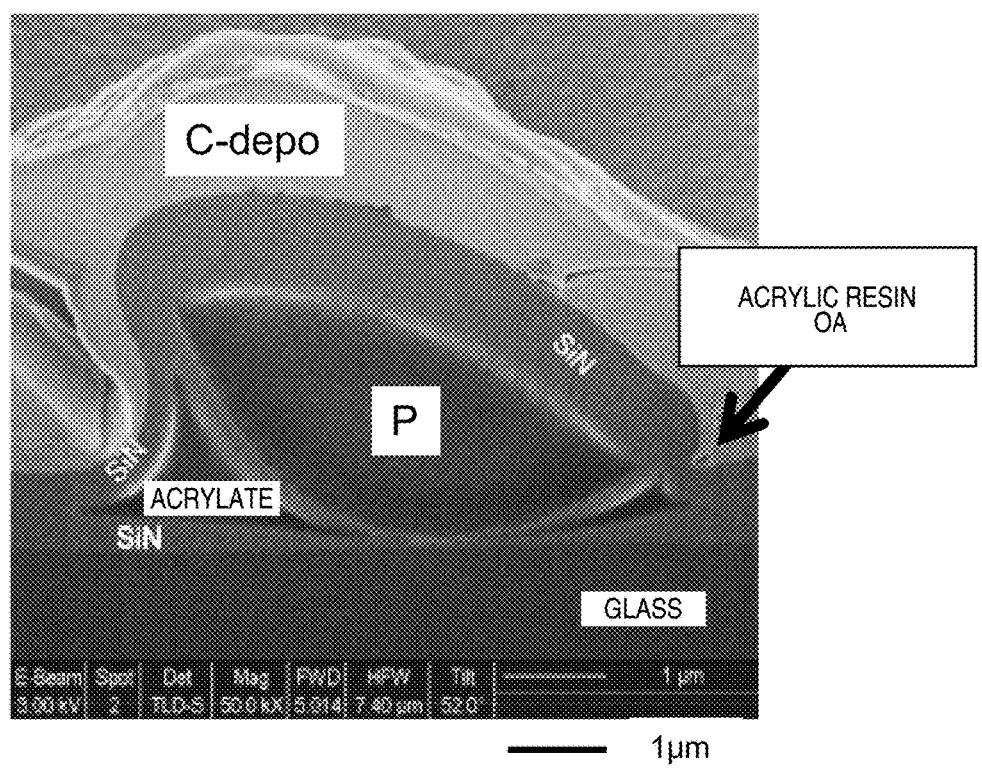
FIG. 11 shows a cross-sectional SEM image of a TFE structure covering a particle (silica convex lens having a diameter of 4.6 μm).

Referring to FIG. 11, in a bottom right portion of a silica convex lens (diameter: 4.6 μm; portion OA in FIG. 11), the organic barrier layer 14 is etched excessively, and as a result, the second inorganic barrier layer 16 is made extremely thin partially. In such a case, the second inorganic barrier layer 16, even if having no defect, may possibly be cracked when an external force is applied to the TFE structure 10 during or after the production of the OLED display device.

An external force may be applied to the TFE structure in the following cases, for example. When the flexible substrate 1 of the OLED display device is lifted-off from a glass substrate provided as a support substrate, a bending stress acts on the OLED display device including the TFE structure 10. When, during the production of a curved-surface display, the OLED display device is bent along a predetermined curved shape, a bending stress acts on the TFE structure 10. Needless to say, in the case where the OLED display device is produced for an application where the flexibility thereof is utilized (for example, in the case where the OLED display device is folded, bent or rolled), various types of stress are applied to the TFE structure 10 during the use of the OLED display device by the user.

In order to prevent this, it is preferred to adjust the asking condition such that more than 50% of the organic barrier layer formed on the flat portion of the OLED 3 is left (such that the organic barrier layer (solid portion) 14b has an area size larger than that of the opening 14a). It is more preferred that 80% or more of the organic barrier layer (solid portion) 40b is left on the flat portion of the OLED 3, and it is most preferred that 100% of the organic barrier layer (solid portion) 40b is left on the flat portion of the OLED 3. As shown in FIG. 8(a) through FIG. 8(d), in the case where the organic barrier layer 14 is appropriately left, the surface of the second inorganic barrier layer 16 formed on the organic barrier layer 14 does not include a portion having an angle of 90% or smaller (see the recessed portion 16d in FIG. 10). Therefore, even if an external force is applied, the stress is suppressed from being concentrated.

The method for producing the OLED display device according to an embodiment of the present invention includes a step of preparing, in a chamber, the OLED 3 having the first inorganic barrier layer 12 formed thereon, a step of supplying a vapor-like or mist-like acrylic monomer into the chamber, a step of condensing the acrylic monomer on the first inorganic barrier layer 12 to form a liquid film, a step of irradiating the liquid film of the acrylic monomer with ultraviolet light to form an acrylic resin layer, and a step of partially asking the acrylic resin layer to form the organic barrier layer 14.

Figure 12:
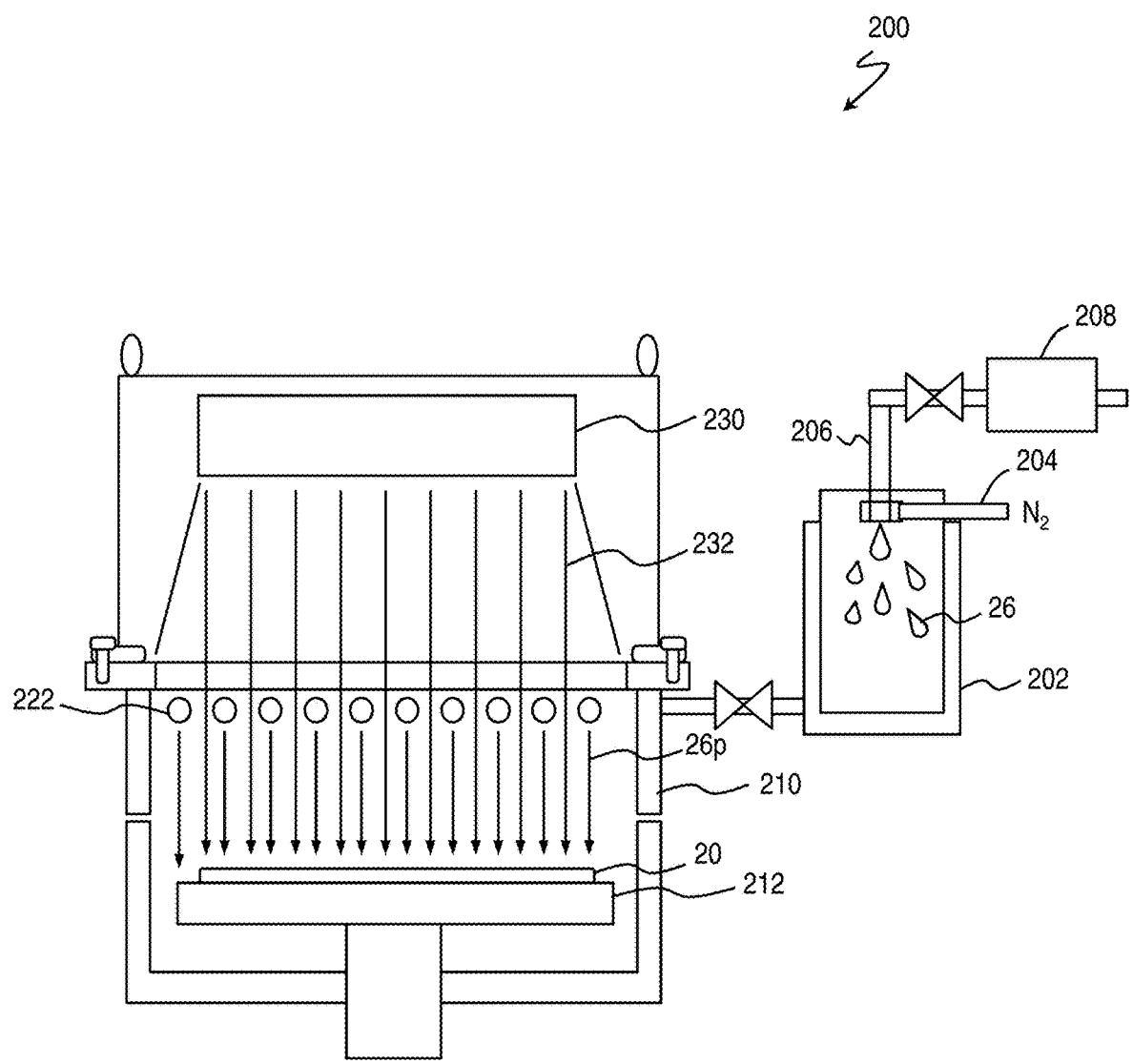
FIG. 12 is a schematic view showing a structure of a film formation device 200 usable to form the organic barrier layer 14.

FIG. 12 schematically shows a structure of the film formation device 200 usable to form the organic barrier layer 14.

The film formation device 200 includes a chamber 210, a stage 212, monomer supply openings (nozzles) 222, and an ultraviolet light irradiation device 230. An inner space of the chamber 210 is controlled to have a predetermined pressure (vacuum degree) and a predetermined temperature. The stage 212 has a top surface that receives an element substrate 20 including a plurality of the OLEDs 3, on which the first inorganic barrier layer is formed. The top surface may be cooled down to, for example, −20° C. The nozzles 222 are used to supply the acrylic monomer (liquid state), supplied in a predetermined flow rate, to the inner space of the chamber 210 in a vapor-like or mist-like state. Such a vapor-like or mist-like acrylic monomer 26p is attached to, or contacts, the first inorganic barrier layer on the element substrate 20. The ultraviolet light irradiation device 230 directs ultraviolet light 232 having a predetermined wavelength and a predetermined intensity toward the top surface of the stage 212.

The acrylic monomer 26 is supplied into the chamber 210 from a container 202 at a predetermined flow rate. The container 202 is supplied with the acrylic monomer 26 via a pipe 206 and also is supplied with nitrogen gas from a pipe 204. The flow rate of the acrylic monomer supplied to the container 202 is controlled by a mass flow controller 208.

The film formation device 200 may be used to form the organic barrier layer 14 in, for example, the following manner. An example described below is one of typical examples of conditions used to produce the TFE structure 10 as a sample or to produce the sample shown in the scanning electron micrographs.

The chamber 210 is supplied with, for example, RANDAP (produced by Shin-Nakamura Chemical Co., Ltd.) as the acrylic monomer 26p. The element substrate 20 has been cooled to, for example, −15° C. on the stage 212. The acrylic monomer 26p is condensed to become a liquid film on the first inorganic barrier layer 12 on the element substrate. The supply amount of the acrylic monomer 26p and the temperature in the chamber 210 are controlled to adjust the thickness of the acrylic monomer (liquid film). The acrylic monomer may be deposited at a rate of, for example, 500 nm/min. Therefore, an acrylic monomer layer having a thickness of about 200 nm is formed within about 24 seconds.

Then, the inner space of the chamber 210 is discharged and the vapor-like or mist-like acrylic monomer 26p is removed. After this, the ultraviolet light 232 is radiated to cure the acrylic monomer on the first inorganic barrier layer 12. The ultraviolet light is radiated at an intensity of, for example, 12 mW/cm² (365 nm) for about 10 seconds.

As can be seen, the tact time of the step of forming the organic barrier layer 14 is 34 seconds, and thus the mass-productivity is very high.

The first inorganic barrier layer 12 is formed, for example, as follows. The inorganic barrier layer 12 having a thickness of 400 nm may be formed by plasma CVD using $SiH_4$ gas and $N_2O$ gas, at a film formation rate of 400 nm/min, in the state where, for example, the temperature of the substrate (the OLED 3), on which the film formation is to be performed, is controlled to be lower than, or equal to, 80° C. The inorganic barrier layer 12 thus formed has a refractive index of 1.84 and a 400 nm visible light transmittance of 90% (thickness: 400 nm). The film stress has an absolute value of 50 MPa.

The organic barrier layer 14 is asked by, for example, plasma ashing using $N_2O$ gas. The ashing is performed in an ashing chamber. The ashing rate is, for example, 500 nm/min. In the case where the organic barrier 14 having a thickness of 200 nm is formed as described above, the ashing is performed for about 22 seconds such that the thickness (maximum value) of the organic barrier layer (solid portion) 14b on the flat portion is about 20 nm.

After the ashing, the $N_2O$ gas is discharged, and the resultant assembly is transported into a CVD chamber in which the second inorganic barrier layer 16 is to be formed. The second inorganic barrier layer 16 is formed under, for example, the same conditions as those for the first inorganic barrier layer 12.

In this manner, the TFE structure 10 and the OLED display device 100 including the TFE structure 10 are produced. According to the method for producing the OLED display device in an embodiment of the present invention, an organic barrier layer having a sufficient thickness is formed and then is asked to form an organic barrier layer having a desired thickness. Therefore, the resin material does not need to be located locally as is required by the production method described in each of Patent Documents Nos. 2 and 3. Thus, the production method according to an embodiment of the present invention provides superb mass-productivity with a wide process margin.

As described above, the surface of the organic barrier layer 14 is oxidized. Therefore, the organic barrier layer 14 is highly adhesive with the first inorganic barrier layer 12 and the second inorganic barrier layer 16, and has a high moisture-resistance reliability. For example, the WVTR of the TFE structure 10 specifically described above as an example (it should be noted that a polyimide film having a thickness of 15 μm is used instead of the OLED 3 shown in FIG. 1) is evaluated to be less than $1 \times 10^{-4}$ g/m²·day, which is the lower limit of detection as converted to a value at room temperature.

The structure in which the organic barrier layer 14 is present substantially entirely between the first inorganic barrier layer 12 and the second inorganic barrier layer 16 provides a high resistance against bending.

The inorganic barrier layer may be an SiO layer, an SiON layer, an SiNO layer, an $Al_2O_3$ layer or the like as well as an SiN layer. The resin usable to form the organic barrier layer may be an ultraviolet-curable resin such as a vinyl-containing monomer or the like in addition to the acrylic resin.

INDUSTRIAL APPLICABILITY

An embodiment of the present invention is applicable to an organic EL display device, specifically, a flexible organic EL display device, and a method for producing the same.

REFERENCE SIGNS LIST

1: Flexible substrate
2: Back plane (circuit)
3: Organic EL element
4: Polarizing plate
10: Thin film encapsulation structure (TFE structure)
12: First inorganic barrier layer (SiN layer)
14: Organic barrier layer (acrylic resin layer)
14a: Opening in the organic barrier layer
14b: Solid portion of the organic barrier layer
14s: Surface of the organic barrier layer (post-asking)
14sa: Surface of the organic barrier layer (pre-asking)
16: Second inorganic barrier layer (SiN layer)
16c: Defect
16d: Recessed portion
20: Element substrate
26: Acrylic monomer
26p: Vapor-like or mist like acrylic monomer
100: Organic EL display device

The invention claimed is:

1. An organic electro-luminescence (EL) display device, comprising:
 an organic EL element on a flexible substrate; and
 a particle on a surface of the organic EL element away from the flexible substrate;
 a thin film encapsulation structure on a surface of the organic EL element away from the flexible substrate to encapsulate the organic EL element;
 wherein:
  the thin film encapsulation structure includes a first inorganic barrier layer, an organic barrier layer in contact with the first inorganic barrier layer, and a second inorganic barrier layer in contact with the organic barrier layer; and
  the organic EL element defines a flat portion; the flat portion is a portion of the surface of the organic EL element excluding a portion in which the particle is attached to the surface of the organic EL element; the organic barrier layer covers at least a part of the flat portion away from the particle.

2. The organic EL display device of claim 1, wherein the organic barrier layer has an opening on the flat portion, and the organic barrier layer present on the flat portion has an area size larger than an area size of the opening.

3. The organic EL display device of claim 1, wherein the organic barrier layer present on the flat portion has a thickness of 10 nm or greater.

4. The organic EL display device of claim 1, wherein the organic barrier layer present on the flat portion has a maximum thickness less than 200 nm.

5. The organic EL display device of claim 1, wherein the first and second inorganic barrier layers are each an SiN layer having a thickness of 200 nm or greater and 1000 nm or less.

6. A method for producing an organic electro-luminescence (EL) display device, comprising:
 forming an organic EL element on a flexible substrate;
 forming a particle on a surface of the organic EL element away from the flexible substrate; and
 forming a thin film encapsulation structure on a surface of the organic EL element away from the flexible substrate to encapsulate the organic EL element;
 wherein:
  the thin film encapsulation structure comprises a first inorganic barrier layer, an organic barrier layer in contact with the first inorganic barrier layer, and a second inorganic barrier layer in contact with the organic barrier layer; and the organic EL element defines a flat portion; the flat portion is a portion of the surface of the organic EL element excluding a portion in which the particle is attached to the surface of the organic EL element; the organic barrier layer covers at least a part of the flat portion away from the particle; and a surface of the organic barrier layer is oxidized, the method comprising the steps of:

preparing, in a chamber, the organic EL element having the first inorganic barrier layer formed thereon;

supplying a vapor-like or mist-like acrylic monomer into the chamber;

condensing the acrylic monomer on the first inorganic barrier layer to form a liquid film;

irradiating the liquid film of the acrylic monomer with ultraviolet light to form an acrylic resin layer; and partially ashing the acrylic resin layer to form the organic barrier layer.

7. The method for producing the organic EL display device of claim 6, wherein the step of ashing is performed such that more than 50% of the acrylic resin layer formed on the flat portion is left.

8. The method of claim 7, wherein the organic barrier layer has an opening on the flat portion, and the organic barrier layer present on the flat portion has an area size larger than an area size of the opening.

9. The method of claim 7, wherein the organic barrier layer present on the flat portion has a thickness of 10 nm or greater.

10. The method of claim 7, wherein the organic barrier layer present on the flat portion has a maximum thickness less than 200 nm.

11. The method of claim 7, wherein the first and second inorganic barrier layers are each an SiN layer having a thickness of 200 nm or greater and 1000 nm or less.

12. The organic EL display device of claim 1, wherein the organic barrier layer completely covers the flat portion.

13. The organic EL display device of claim 1, wherein the first inorganic barrier layer covers both the particle and the organic EL element; the organic barrier layer fills a crack in the first inorganic barrier layer and surrounding the particle.

14. The organic EL display device of claim 1, wherein a surface of the organic barrier layer is oxidized.

* * * * *